United States Patent
Han et al.

(10) Patent No.: US 11,527,413 B2
(45) Date of Patent: Dec. 13, 2022

(54) CYCLIC PLASMA ETCH PROCESS

(71) Applicant: Tokyo Electron Limited, Tokyo (JP)

(72) Inventors: Yun Han, Albany, NY (US); Peter Ventzek, Austin, TX (US); Alok Ranjan, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/162,623

(22) Filed: Jan. 29, 2021

(65) Prior Publication Data

US 2022/0246438 A1    Aug. 4, 2022

(51) Int. Cl.
*H01L 21/311* (2006.01)
*H01J 37/32* (2006.01)

(52) U.S. Cl.
CPC .. *H01L 21/31116* (2013.01); *H01J 37/32091* (2013.01); *H01J 37/32449* (2013.01); *H01L 21/31138* (2013.01); *H01L 21/31144* (2013.01); *H01J 2237/334* (2013.01)

(58) Field of Classification Search
CPC ......... H01L 21/31116; H01L 21/31138; H01L 21/31144; H01J 37/32091; H01J 37/32449; H01J 2237/334
USPC ....... 438/706, 710, 712, 714, 717, 719, 720, 438/723, 725, 735, 758, 738
See application file for complete search history.

(56) References Cited

U.S. PATENT DOCUMENTS

| 6,399,511 | B2 |   | 6/2002 | Tang et al. |   |
|---|---|---|---|---|---|
| 10,269,576 | B1 | * | 4/2019 | Huang | ................ H01L 21/0337 |
| 2007/0243714 | A1 | * | 10/2007 | Shin | .................. H01L 21/31122 438/706 |
| 2015/0179466 | A1 | * | 6/2015 | Takayama | ......... H01L 21/32137 438/694 |
| 2016/0379841 | A1 | * | 12/2016 | Hidaka | ............. H01L 21/31122 438/714 |
| 2017/0117118 | A1 | * | 4/2017 | Toh | ................... H01J 37/32715 |

FOREIGN PATENT DOCUMENTS

WO    2017151383 A1    9/2017

* cited by examiner

*Primary Examiner* — Lan Vinh
(74) *Attorney, Agent, or Firm* — Slater Matsil, LLP

(57) ABSTRACT

A method for processing a substrate includes performing a cyclic plasma etch process including a plurality of cycles, where each cycle of the plurality of cycles includes: causing chemical reactions with the surface of the substrate by exposing a surface of the substrate to fluorine radicals extracted from a first gas discharge plasma formed using a first gaseous mixture including a non-polymerizing fluorine compound; cooling the substrate and concurrently removing residual gaseous byproducts by flowing a second gaseous mixture over the substrate, and at the same time, suppressing the chemical reactions with the surface of the substrate; and performing a plasma surface modification process by exposing the surface of the substrate to hydrogen radicals extracted from a second gas discharge plasma formed using a third gaseous mixture including gases including nitrogen and hydrogen.

20 Claims, 5 Drawing Sheets

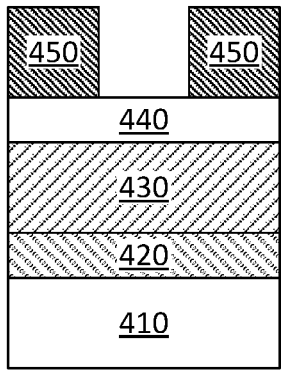
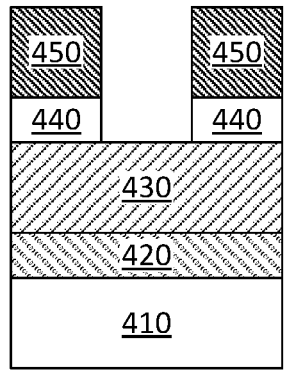
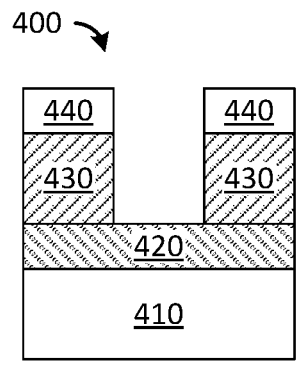
Figure 4A
Figure 4B
Figure 4C
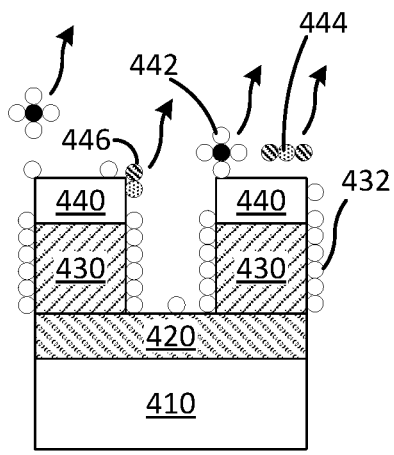
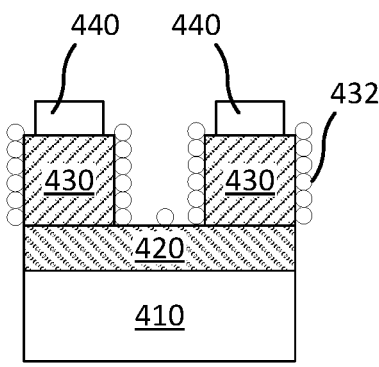
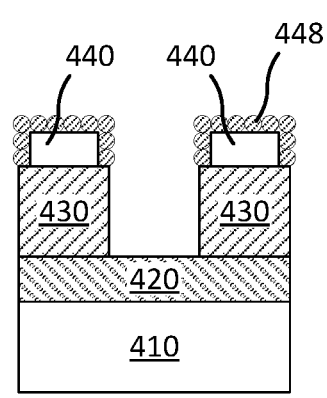
Figure 4D
Figure 4E
Figure 4F
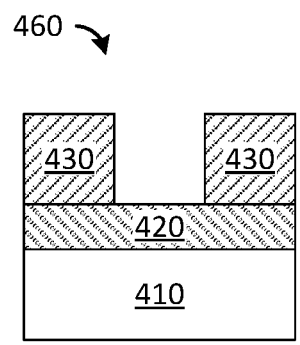
Figure 4G

CYCLIC PLASMA ETCH PROCESS

TECHNICAL FIELD

The present invention relates generally to a method for processing a semiconductor device, and, in particular embodiments, to a system and methods for cyclic plasma etching.

BACKGROUND

Generally, a semiconductor device, such as an integrated circuit (IC) is fabricated by sequentially depositing and patterning layers of dielectric, conductive, and semiconductor materials over a substrate to form a network of electronic components and interconnect elements (e.g., transistors, resistors, capacitors, metal lines, contacts, and vias) integrated in a monolithic structure. Many of the processing steps used to form the constituent structures of semiconductor devices are performed using plasma processes. Plasma processing techniques include chemical dry etching (CDE) (e.g., plasma ashing), physical or sputter etching, reactive ion etching (RIE), plasma-enhanced chemical vapor deposition (PECVD), plasma-enhanced atomic layer etch (PEALE), and atomic layer deposition (PEALD).

Driven by an insatiable demand for low cost electronics with high functionality, the minimum feature sizes have been shrunk to reduce cost by roughly doubling the component packing density at each successive technology node. Innovations in patterning such as immersion photolithography, multiple patterning, and 13.5 nm wavelength extreme ultraviolet (EUV) optical systems have brought critical feature sizes down close to ten nanometers. Concurrently, unconventional materials such as organics, ferroelectrics, and chalcogenides are being increasingly used in products. This scenario poses a challenge for plasma technology to provide processes for patterning features with accuracy, precision, and profile control, often at atomic scale dimensions. Meeting this challenge along with the uniformity and repeatability needed for high volume IC manufacturing requires further innovations.

SUMMARY

In an embodiment, a method for processing a substrate includes performing a cyclic plasma etch process including a plurality of cycles, where each cycle of the plurality of cycles includes: causing chemical reactions with the surface of the substrate by exposing a surface of the substrate to fluorine radicals extracted from a first gas discharge plasma formed using a first gaseous mixture including a non-polymerizing fluorine compound. The method includes flowing a second gaseous mixture over the substrate, and at the same time, suppressing the chemical reactions with the surface of the substrate. The method includes exposing the surface of the substrate to hydrogen radicals extracted from a second gas discharge plasma formed using a third gaseous mixture including gases including nitrogen and hydrogen.

In an embodiment, a method for processing a substrate includes performing a cyclic plasma etch process including a plurality of cycles. Each cycle of the plurality of cycles includes: performing a plasma etch process on a surface of the substrate that includes a silicon-based material to partially remove the silicon-based material, cooling the substrate and concurrently removing residual gaseous byproducts, and performing a plasma surface modification process on the substrate.

In an embodiment, a method for fabricating a semiconductor device includes forming a stack of patterned layers adjacent to an underlayer in a substrate. The stack of patterned layers includes an organic layer adjacent to the underlayer and a hardmask layer including a silicon-based material over the organic layer; loading the substrate in a plasma processing chamber. The method includes performing a cyclic plasma etch process in situ in the plasma process chamber, where the cyclic plasma etch process removes the hard mask layer including a silicon-based material selective to the organic layer.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1A-1C illustrate cross-sectional views of a substrate at various intermediate stages of fabrication in a fabrication process flow undergoing a cyclic plasma etch process, in accordance with various embodiments, wherein FIG. 1A illustrates the incoming substrate, FIG. 1B illustrates after a pattern transfer etch, and FIG. 1C illustrates after the completion of the cyclic plasma etch process;

FIGS. 4A-4F illustrate cross-sectional views of a substrate at various intermediate stages of fabrication in a fabrication process flow comprising the cyclic plasma etch process, illustrated in the flow diagram in FIG. 1D, wherein FIG. 4A illustrates the substrate after forming a patterned sacrificial masking layer, FIG. 4B illustrates the substrate after patterning a silicon-based layer, FIG. 4C illustrates the substrate after transferring the pattern to a organic layer, FIG. 4D illustrates the substrate after the plasma chemical dry etch (CDE) process, FIG. 4E illustrates the substrate after a cooldown and cleanup process, and FIG. 4F illustrates the plasma surface modification process;

FIG. 4G illustrates a cross-sectional view of the substrate after completing the cyclic plasma etch process, illustrated in FIGS. 4A-4F.

DETAILED DESCRIPTION OF ILLUSTRATIVE EMBODIMENTS

Figure 1D:
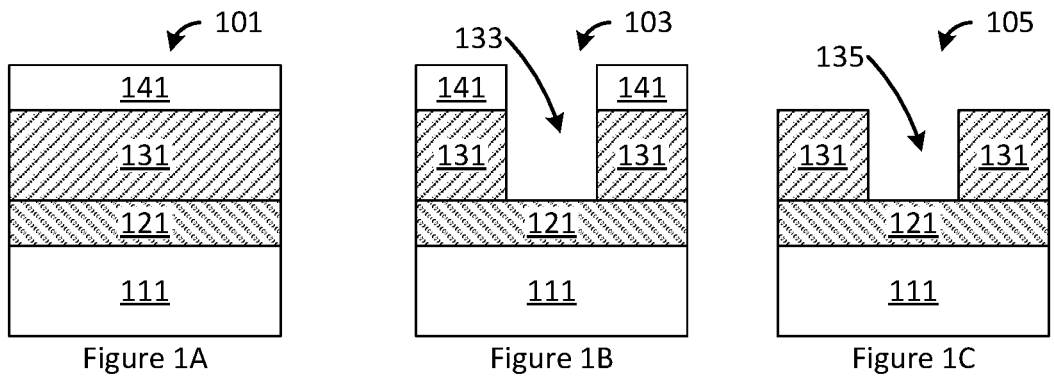
FIG. 1D illustrates a flow diagram a cyclic plasma etch process, in accordance with various embodiments.
Figure 1D:
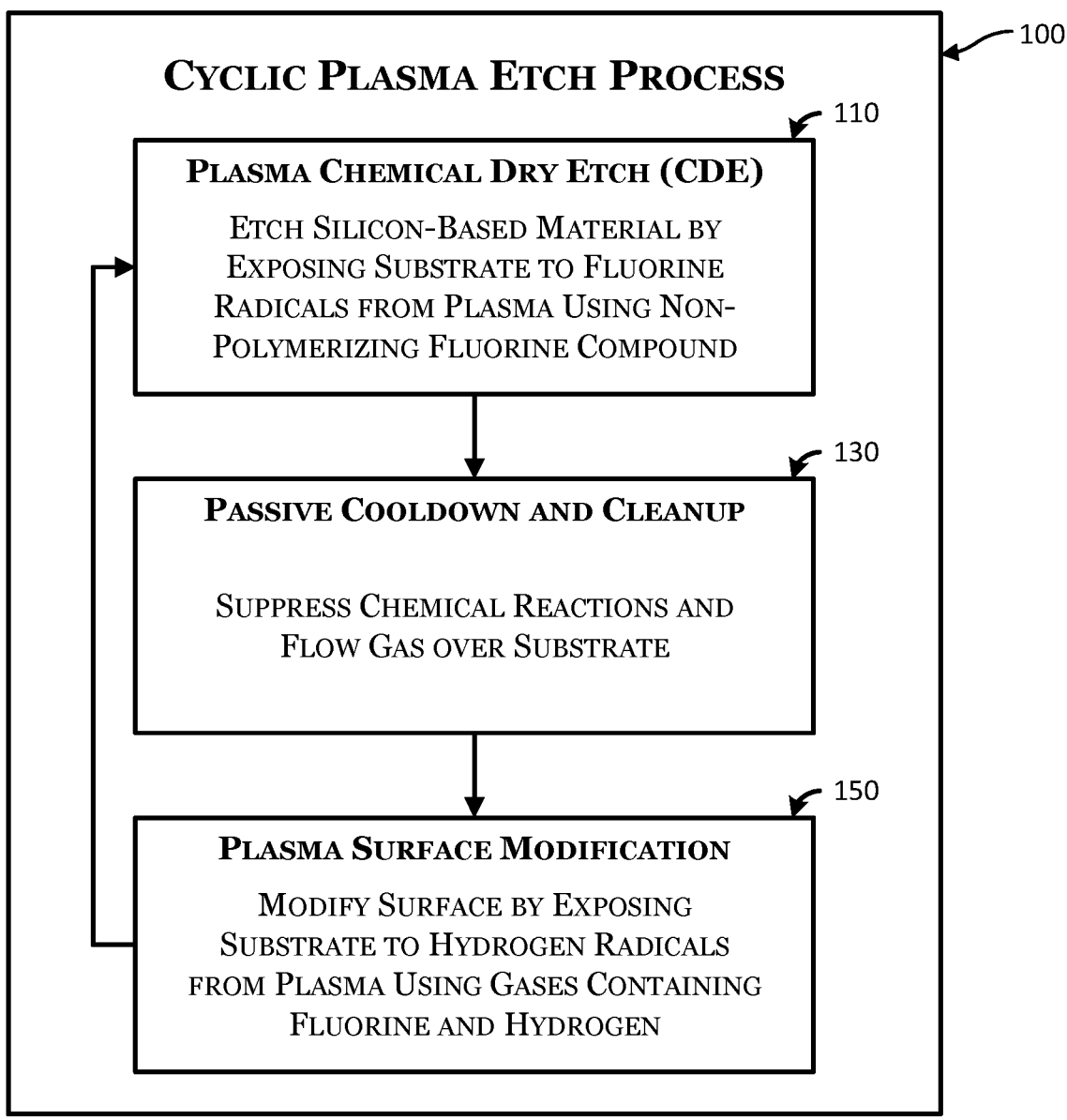

This disclosure describes embodiments of a cyclic plasma etch method for removing silicon-based materials with selectivity to organics. The embodiments described herein provide the advantages of efficient removal of the silicon-based material while reducing loss of material from an underlying organic layer, reducing deformation of sidewalls of features in a patterned organic layer that may be exposed to the etchants, and reducing defects generated by deposition of etch byproducts. The innovative methods achieve these advantages by employing a cyclic etching technique that allows the etch process to be split into three segregated components, as described further below.

A generic embodiment of implementing a cyclic plasma process will be described using the cross sectional views of FIGS. 1A-1C along with the flow charts of FIGS. 1D-1E. Further details and embodiments of the method will be described using FIGS. 4A-4F and 5. Systems for implementing the method will described using FIGS. 2 and 3.

Referring to FIG. 1A, the cyclic plasma etching technique may be performed on a stack of layers in a substrate layer 111. In FIG. 1A, the top layer is the silicon-based layer 141 that is the target layer for the removal process. The processing, described in detail below, removes silicon-based material selective to an organic layer 131, disposed below the silicon-based layer 141. Below the organic layer 131 is an underlayer 121 formed over a stack of layers, collectively shown as a substrate layer 111. In some embodiment of a process flow comprising the cyclic plasma etch, the incoming substrate for the cyclic plasma etch may be the stack of layers in a first intermediate structure 101. In some other embodiment, the incoming substrate for the cyclic plasma etch may be the stack of layers in a second intermediate structure 103, illustrated in FIG. 1B. The second intermediate structure 103 may be formed by patterning the silicon-based layer 141 and the organic layer 131 of the first intermediate structure 101.

In various embodiments, the silicon-based layer 141 may comprise materials such as silicon oxide, silicon nitride, silicon oxynitride, or silicon-rich silicon oxide used as a silicon antireflective coating (SiARC). The organic layer 131 may comprise an organic dielectric layer (ODL), an organic planarization layer (OPL), a spin-on carbon (SOC), or an amorphous carbon layer (ACL). The underlayer 121 may comprise, for example, titanium nitride, aluminum oxide, titanium oxide, or aluminum nitride.

FIG. 1B shows the patterned second intermediate structure 103 after a pattern transfer etch has been performed to pattern the organic layer 131 using the patterned silicon-based layer 141 as the etch mask and the underlayer 121 as the etch-stop layer. The silicon-based layer 141 may have been patterned using a suitable photolithography and plasma etch technique. The process steps used to pattern the silicon-based layer 141 and the organic layer 131 may be same as those used to pattern the silicon-based layer 141 and the organic layer 131, as described in further detail below with reference to FIGS. 4A-4C.

In various applications, the cyclic plasma etch may be used to strip the patterned silicon-based layer 141, seen in FIG. 1B. The cyclic plasma etch process is designed to strip the silicon-based layer 141 from the second intermediate structure 103 while being selective to the exposed organic layer 131 and the exposed underlayer 121, and at the same time preserving the integrity of patterned features, for example, the cavity 133 in FIG. 1B.

The third intermediate structure 105, shown in FIG. 1C illustrates the structure after the plasma cyclic etch has been completed. As mentioned earlier and illustrated in FIGS. 1B and 1C, one advantage of using the plasma cyclic etch process to strip the silicon-based layer 141 is that the original dimensions and shape of the cavity 133 are largely preserved in the cavity 135 (in FIG. 1C) after the silicon-based layer 141 has been stripped. The process of stripping the silicon-based layer 141 has hardly deformed the patterned features in the organic layer 131. Deformation of a feature may comprise rounding of the edges along the top of the cavity 135, undercutting and gouging at the bottom of the cavity 135, changes in the sidewall profile, and increase in surface roughness. Some of the metrics monitored during manufacturing are affected by deformation of patterned features. These include a critical dimension (CD), e.g., a width of the cavity 135, and a sidewall angle of the sidewalls of the cavity 135. By using the plasma cyclic etch to strip the silicon-based layer 141, an upper bound for a change in CD from its target value may be between 1 nm to about 1.8 nm, and an upper bound for a change in sidewall angle may be between 0.4° and 0.5°, where the respective target values for CD may be about 10 nm to about 18 nm and the respective target values for the sidewall angle may be about 85° to about 90°, in various embodiments.

The three segregated components of the cyclic plasma etch are described in a flow diagram illustrated in FIG. 1D. A more detailed flow diagram illustrated in FIG. 1E describes the function of each component.

FIG. 1D illustrates a flow diagram for a cyclic plasma etch process 100 that may be used to remove exposed silicon-based material from a substrate. As illustrated in FIG. 1D, each cycle comprises three segregated components performed successively on the substrate. First, a plasma chemical dry etch (CDE) process 110 that removes the silicon-based material is performed by exposing a surface of the substrate to fluorine radicals extracted from a first gas discharge plasma formed using a first gaseous mixture comprising a non-polymerizing fluorine compound. The etch chemistry used for the CDE removes silicon-based material selective to the organic material and the material of the underlayer below the organic layer. In one embodiment, the CDE process removes the silicon-based material isotropically. This is followed by a passive cooldown and cleanup process 130, during which chemical reactions are suppressed, e.g., by powering down the plasma. Flowing a second gaseous mixture without inducing chemical reactions may serve the dual purpose of cooling the substrate and cleaning up the surface by removing residual gaseous byproducts. After the cooldown and cleanup process is complete, a plasma surface modification process 150 is performed by exposing the surface of the substrate to hydrogen radicals extracted from a second gas discharge plasma formed using a third gaseous mixture comprising gases containing nitrogen and hydrogen atoms.

Figure 1E:
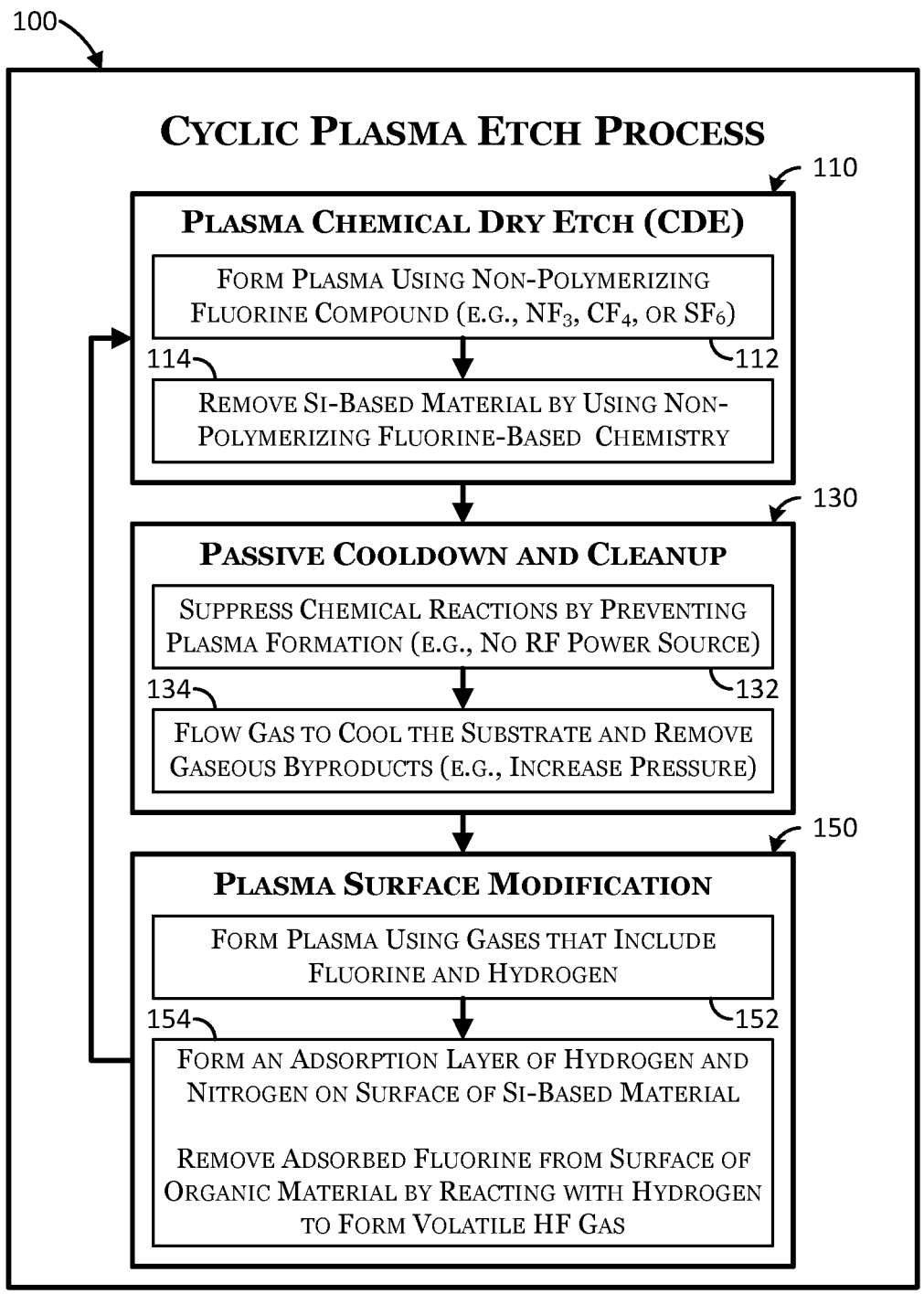
FIG. 1E is a detailed flow diagram of the cyclic plasma etch process, illustrated in the flow diagram in FIG. 1D.

Referring now to FIG. 1E, in one or more embodiments, the plasma chemical dry etch (CDE) process 110 comprises forming the first gas discharge plasma to generate the fluorine radicals (box 112) and exposing the surface of the substrate to a flux of fluorine radicals to remove silicon-based material (box 114). As indicated in box 112, a first gaseous mixture used in forming the plasma comprises a non-polymerizing fluorine compound. In various embodiments, the first gaseous mixture may comprise nitrogen trifluoride (NF 3), sulfur hexafluoride ($SF_6$), or carbon tetrafluoride ($CF_4$). The first gaseous mixture may also include inert gases such as argon and helium as a diluent. A small amount of oxygen ($O_2$) may be added along with the $SF_6$. Likewise, a small amount of $O_2$ may be added if $CF_4$ is used instead of $SF_6$. The $O_2$ content may be, for example, between 2% to 10% of the total volume of process gases used for the first gaseous mixture. Adding the small amount of $O_2$ may effectively suppress deposition of solid sulfur or carbon compounds. Oxygen may not be added to $NF_3$ since no solid deposits comprising nitrogen are formed.

Solid byproducts are undesirable for the etch chemistry used to strip the silicon-based layer 141 (shown in FIG. 1B)

because the solid byproducts may deposit randomly over the surface and cause defects by inhibiting the chemical reaction used to remove silicon-based material. Reactant gases that may cause polymers to form and get deposited, often non-uniformly, over the exposed surface of the organic layer 131 in FIGS. 1B and 1C are avoided. For example, if a hydrofluorocarbon ($CHF_3$, $CH_3F$, and $CH_2F_2$) or a perfluorocarbon with relatively high carbon content (e.g., $C_2F_6$, and $C_3F_8$) is used as a source of fluorine radicals then polymerizing reactions can take place. The polymers may deposit along the sidewall of the cavity 135 in FIG. 1C and change the CD (the width of the opening) and the sidewall angle of the cavity 135. In the embodiments of the plasma CDE process 110 described in this disclosure, the fluorine etch chemistry is selected such that deposition of solid byproducts is suppressed. Sources of fluorine radicals used for the cyclic plasma etch process 100 exclude hydrofluorocarbons ($CHF_3$, $CH_3F$, and $CH_2F_2$). The presence of hydrogen in hydrofluorocarbons may trigger formation of solid byproducts by polymerization. Because polymerization may also occur in an etch chemistry using perfluorocarbon with a relatively high carbon content, perfluorocarbons such as $C_2F_6$, and $C_3F_8$ are also excluded. The higher the carbon to fluorine ratio, the more likely it is that the chemical reaction used to remove silicon-based materials would be polymerizing, causing solid deposits on the surface of the organic layer 131.

As mentioned above, the etch chemistry using NF 3, is non-polymerizing; no solid deposits occur during the etch process. The non-polymerizing property of $CF_4$ and $SF_6$ may be attributed to a low ratio of carbon to fluorine atoms in $CF_4$ (C:F=1:4 in $CF_4$) and a low ratio of sulfur to fluorine atoms in $SF_6$ (S:F=1:6 in $SF_6$). A non-polymerizing etch chemistry with negligible solid byproducts is often referred to as lean etch chemistry. Since the source of fluorine in various embodiments of the cyclic plasma etch process 100 is either $NF_3$, $CF_4$, or $SF_6$, an etch chemistry used to etch silicon-based materials in the example embodiments in this disclosure may be referred to as lean chemistry or a non-polymerizing fluorine-based chemistry, as indicated in box 114 in FIG. 1E.

The flux of fluorine radicals chemically removes silicon-based materials by reacting with silicon to form silicon tetrafluoride ($SiF_4$), a volatile gaseous byproduct. Other volatile gaseous byproducts may include oxides of nitrogen (e.g., nitric oxide (NO), nitrogen dioxide ($NO_2$), and nitrous oxide ($N_2O$)) in embodiments using $NF_3$, oxides and oxyfluorides of sulfur (e.g., $SO_2$ and $SOF_2$) in embodiments using $SF_6$, and oxides of carbon (e.g., CO and $CO_2$) in embodiments using $CF_4$. Exposed surfaces of the organic material and the underlayer may get fluorinated by adsorption of fluorine radicals on the exposed organic material.

As shown in FIGS. 1D and 1E, a passive cooldown and cleanup process 130 is performed after the plasma chemical dry etch (CDE) process 110. The chemical reactions used to remove the silicon-based material are exothermic. The substrate temperature may rise rapidly and may lead to thermal deformation of features in the organic layer if the temperature rises to close to the glass transition temperature of the organic material. During the cooldown and cleanup process 130, a sufficiently high flow rate of a second gaseous mixture is used to cool the substrate and remove residual gaseous byproducts. As indicated in boxes 132 and 134, the cooldown and cleanup process 130 is performed without forming plasma to ensure that no chemical reactions are induced by the second gaseous mixture as it flows over the substrate. Plasma formation during cooldown may be prevented by shutting off radio frequency (RF) power to a plasma system where the cyclic plasma process is implemented by temporally segregating the three components of each cycle using time-multiplexing. In a spatially segregated implementation, the substrate is moved to a section of the plasma system that is not coupled to an RF power source. A relatively high pressure may be selected to achieve an increased gas flow rate for more efficient cooling and cleanup, as indicated in box 134. The composition of the second gaseous mixture is selected such that the gases would not chemically modify the surface of the substrate at the prevalent temperature in the absence of plasma. In one embodiment the gases used in the second gaseous mixture are selected to be same as the process gases used in the next component of the cycle.

As seen in the flow diagrams for the cyclic plasma etch process 100, illustrated in FIGS. 1D and 1E, the next component is the third and last component of the cycle, during which a plasma surface modification process 150 may be performed. As indicated in box 152 in FIG. 1E, a second gas discharge plasma is formed using a third gaseous mixture for the plasma surface modification process 150. The composition of the third gaseous mixture comprises hydrogen and a small amount of a source of fluorine (e.g., $NF_3$, $CF_4$, or $SF_6$). In one embodiment the third gaseous mixture comprises $NF_3$ and $H_2$. In other embodiments, the third gaseous mixture comprises $CF_4$ and $H_2$ or $SF_6$ and $H_2$. A small amount of oxygen may be optionally included in the third gaseous mixture.

The plasma surface modification process 150 comprises exposing the surface of the substrate to hydrogen radicals extracted from the second gas discharge plasma. After patterning the organic layer 131 using the silicon-based layer 141 as an etch mask and the underlayer 121 as an etch stop layer, as illustrated in FIG. 1B, the surface of the second intermediate structure 103 may have a first portion (e.g., a top flat surface) comprising the silicon-based material, a second portion (e.g., sidewalls of features) comprising the organic material, and a third portion (e.g., a bottom wall) comprising the underlayer 121 below the organic layer 131. Exposure to hydrogen radicals modifies the first portion of the surface differently compared to the other portions of the surface.

The surface of the silicon-based layer 141 is activated in a surface modification process in which hydrogen attaches to the surface of the silicon-based layer 141 (the first portion) so as to facilitate the removal of the Si-based material in the next cycle. Without the surface modification, the etch rate would be lower. The interaction of hydrogen with the second and third portions of the surface is a surface reset that chemically removes adsorbed fluorine. During the surface modification process, the exposed surface of the organic layer 131 and the underlayer 121 (second and third portions) may be defluorinated by chemically reacting with hydrogen to form HF vapor that gets pumped out of the process chamber.

As explained above, the plasma surface modification process 150 (in FIGS. 1D and 1E) uses hydrogen plasma for surface activation of the silicon-based layer 141 and surface reset of the organic layer 131. In addition, by including a small amount of a source of fluorine (e.g., $NF_3$, $CF_4$, or $SF_6$) in the third gaseous mixture, the silicon-based layer 141 is allowed to continue to be etched, albeit at a much lower removal rate than that during the plasma CDE process 110.

In some embodiments, the cyclic plasma process may be implemented by temporally segregating the three components of each cycle using time-multiplexing. The substrate may be loaded in a plasma chamber and the three components of each cycle of the cyclic plasma process be performed in situ in the plasma process chamber in three consecutive non-overlapping time intervals. In some other embodiments, the three components of the cyclic plasma process may be segregated by moving the substrate through three spatially segregated sections of a plasma chamber, as described in further detail below with reference to FIG. 3.

In one embodiment of the time-multiplexed cyclic plasma process, the plasma CDE that removes the silicon-based material may be performed during a first time interval using a first gaseous mixture, as described above.

During a second time interval, the substrate may be cooled and, concurrently, residual gaseous byproducts may be removed by creating a gas flow using a second gaseous mixture, as mentioned above. To suppress chemical reactions, the plasma may be extinguished by, for example, decoupling the plasma from RF power, or shutting off the RF power sources. The pressure in the plasma chamber may be increased to increase the flow rate to achieve efficient cooling and cleanup.

In a third time interval following the second time interval, the pressure in the plasma process chamber may be reduced again, and a second gas discharge plasma may be ignited using a third gaseous mixture comprising hydrogen for the plasma surface modification process. As described above, the plasma surface modification process activates the surface of the silicon-based material, and resets the surface of the organic material by defluorinating with hydrogen radicals.

Figure 2:
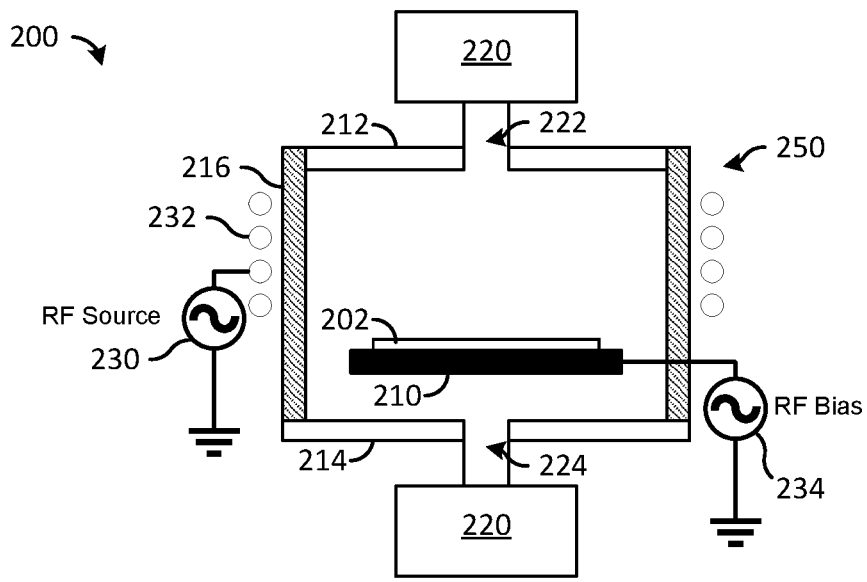
FIG. 2 illustrates a cross-sectional view of a plasma system for performing a time-multiplexed implementation of the cyclic plasma etch process, illustrated in the flow diagram in FIG. 1D.
Figure 3:
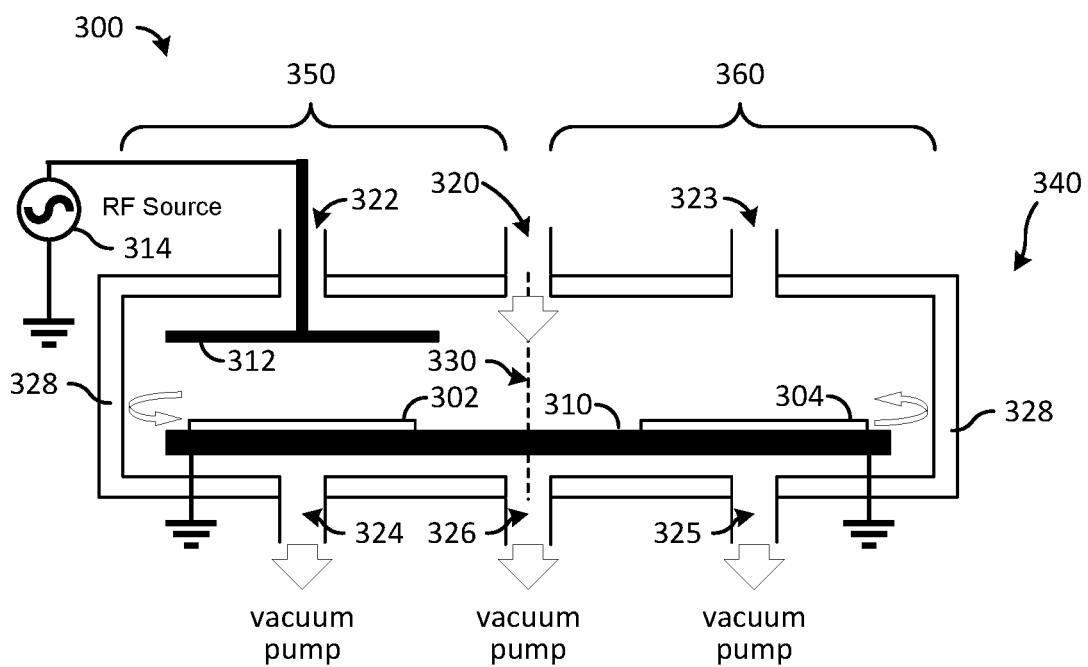
FIG. 3 illustrates a cross-sectional view of a plasma system for performing a spatially segregated implementation of the cyclic plasma etch process, illustrated in the flow diagram in FIG. 1D.

FIGS. 2 and 3 illustrate examples of plasma systems that may be used to implement the method and perform the cyclic plasma etch process on an incoming substrate comprising a silicon-based layer over an organic layer. FIG. 2 illustrates a plasma system for time-multiplexed implementations of the cyclic plasma etch process, and FIG. 3 illustrates a plasma system for spatially segregated implementations of the cyclic plasma etch process.

The time-multiplexed embodiments of the cyclic plasma etch process 100, wherein the three components of each cycle are executed in the three time intervals may be implemented in the plasma system 200, illustrated in FIG. 2. The plasma system 200 in FIG. 2 comprises a plasma process chamber 250 configured to sustain plasma directly above the substrate 202 loaded onto a substrate holder 210. A gaseous mixture may be introduced in the plasma process chamber 250 through a gas inlet 222 and gases may be pumped out of the plasma process chamber 250 through a gas outlet 224. The gas flow rates and chamber pressure are controlled by a gas flow system 220 coupled to the gas inlet 222 and the gas outlet 224. As known to persons skilled in the art, a gas flow system may comprise various components such as high pressure gas canisters, valves (e.g., throttle valves), pressure sensors, gas flow sensors, vacuum pumps, pipes, and electronically programmable controllers. An RF bias power source 234 and an RF source power source 230 may be coupled to respective electrodes of the plasma process chamber 250. In the plasma process chamber 250, the substrate holder 210 is also the electrode coupled to the RF bias power source 234. The RF source power source 230 is shown coupled to a helical electrode 232 coiled around a dielectric sidewall 216. In FIG. 2, the gas inlet 222 is an opening in a top plate 212 and the gas outlet 224 is an opening in a bottom plate 214. The top plate 212 and bottom plate 214 may be conductive and electrically connected to the system ground (a reference potential).

The plasma system 200 is by example only. In various alternative embodiments, the plasma system 200 may be configured to sustain inductively coupled plasma (ICP) with RF source power coupled to a planar coil over a top dielectric cover, or capacitively coupled plasma (CCP) sustained using a disc-shaped top electrode in the plasma process chamber 250. Gas inlets and outlets may be coupled to sidewalls of the plasma chamber, and pulsed RF power sources and pulsed DC power sources may also be used in some embodiments.

FIG. 3 illustrates an example plasma system 300 comprising a plasma process chamber comprising several spatially segregated sections that may be isolated by a flow of inert gas, referred to as an inert curtain. A plasma process chamber comprising spatially segregated sections is referred to here as a spatial plasma process chamber. The spatial plasma process chamber 340 of the plasma system 300 is suitable for performing spatially segregated implementations of the cyclic plasma etch process 100. In the plasma system 300, the three components of each cycle may be performed in three spatially segregated sections of a spatial plasma process chamber 340. The three components of each cycle of the cyclic plasma etch process 100 may be performed by moving the substrate through the three spatially segregated sections of a spatial plasma process chamber 340 using for example, a rotatable stage 310, as illustrated in FIG. 3. In the example embodiment in FIG. 3, the rotatable stage 310 has been electrically coupled to ground.

In the cross-sectional view illustrated in FIG. 3, two of the three sections are visible. A first section 350 may be used, for example, to perform the first component of each cycle, which is the plasma CDE process 110 described above with reference to FIGS. 1D and 1E. In the example spatial plasma process chamber 340, the first section 350 is configured to sustain capacitively coupled plasma (CCP) using a top electrode 312 coupled to an RF power source 314. In the illustrated configuration, the grounded rotatable stage 310 may serve as a bottom electrode. The first gas discharge plasma may be formed in the first section 350 using a first gaseous mixture introduced in the first section 350 through a first gas inlet 322. A first gas outlet 324 of the first section 350 may be connected to a vacuum pump of a gas flow system and controlled to maintain a desired pressure and gas flow, as indicated by an arrow near the first gas outlet 324. As illustrated in FIG. 3, a first semiconductor wafer 302, shown loaded on the rotatable stage 310 in the first section 350, may be undergoing the first component of one cycle of the plurality of cycles of the cyclic plasma etch process 100. Subsequently, the first semiconductor wafer 302 may be moved to a second section 360 of the spatial plasma process chamber 340 to undergo the second component of the cycle. An inert curtain 330, indicated schematically by a dashed line in FIG. 3 may adequately isolate the first section 350 from the second section 360. The inert curtain 330 may be a flow of an inert gas (e.g., argon or helium) introduced through an inert gas inlet 320 and pumped out through an inert gas outlet 326, as indicated by arrows near the inert gas inlet 320 and the inert gas outlet 326.

As illustrated in FIG. 3, the second section 360 has no top electrode because this section has been designated for performing the second component, which is the cooldown and cleanup process 130 of each cycle. As explained above with reference to FIGS. 1D and 1E, in the cooldown and cleanup process 130, the second gaseous mixture may be flowing over the substrate in the absence of plasma in order to suppress chemical reactions. A second semiconductor wafer 304, shown loaded on the rotatable stage 310 in the second section 360, may be undergoing the second component of one cycle of the plurality of cycles of the cyclic plasma etch process 100. As illustrated in FIG. 3, the second gaseous mixture may be introduced through a second gas inlet 323 and flow out through a second gas outlet 325 coupled to a separately controlled vacuum pump to maintain a desired pressure and flow rate in the second section 360. In the example plasma system 300, the spatial plasma chamber 340 has three sections, each of which may have a semiconductor wafer loaded on the rotatable stage 310. One revolution of the rotatable stage 310 would then be equivalent of performing one cycle of the cyclic plasma etch process 100.

It may be noted that although, in the description of one cycle of the plurality of cycles of the cyclic plasma etch process 100, the plasma CDE process 110 has been shown as the component that is executed first, it is understood that any of the other two components (the passive cooldown and cleanup process 130 and the plasma surface modification process 150) could be selected to be performed first, as long as the sequence in which the three components are performed remains unaltered. For example, the cyclic plasma etch process 100 may be executed with the first cycle starting with the plasma surface modification process 150, followed by the plasma CDE process 110, followed by the passive cooldown and cleanup process 130, and then repeating this sequence of three components multiple times, as prescribed in a process flow recipe used to process the respective substrate.

An example fabrication process flow, incorporating an embodiment of the cyclic plasma etch technique, is described with reference to FIGS. 4A-4G. In FIGS. 4A-4F, the cyclic plasma etch process has been illustrated with cross-sectional views of a substrate at various intermediate stages of the fabrication process flow showing the processing used to fabricate the incoming substrate and being processed through one cycle of a plurality of cycles of the cyclic plasma etch. FIG. 4G illustrates a cross-sectional view of the substrate after completing the cyclic plasma etch process.

The cross-sectional views of a substrate in FIGS. 4A-4F illustrate an example of a process flow comprising the cyclic plasma etch process 100, illustrated in the flow diagram in FIG. 1D, and FIG. 4G illustrates a cross-sectional view of the substrate after completing the cyclic plasma etch process 100.

FIGS. 4A-4C illustrate cross-sectional views of a substrate comprising a silicon-based layer 440 and an organic layer 430 disposed below the silicon-based layer 440 being patterned using a sacrificial masking layer 450. Below the organic layer 430 is an underlayer 420 formed over a stack of layers, collectively shown as a substrate layer 410. As described above with reference to FIGS. 1D and 1E, in various embodiments, the silicon-based layer 440, the organic layer 430, and the underlayer 420 may comprise various materials. For specificity, in the example embodiment illustrated in FIG. 4A, silicon-based layer 440 comprises SiARC, the organic layer 430 comprises SOC, and the underlayer 420 comprises titanium nitride. The sacrificial masking layer 450 comprises photoresist and the material of the substrate layer 410 adjacent below the underlayer 420 comprises a low-k silicon oxide used as an interlayer dielectric (ILD).

The patterned sacrificial masking layer 450, illustrated in FIG. 4A, may have been patterned using a suitable photolithography system, such as extreme ultraviolet (EUV) photolithography. While patterning photoresist with a pattern of actinic radiation, reflections from underlying interfaces may cause interference patterns within the photoresist that degrade the pattern quality of the photoresist relief pattern.

One purpose of the silicon-based layer 440 (the SiARC layer) is to suppress the reflections by destructive interference of radiation reflected from the top and bottom surfaces of the SiARC. The second purpose of the silicon-based layer 440 is, after being patterned, to serve as a hard mask during an etch process used to transfer the pattern to the organic layer 430.

In FIG. 4B, the sacrificial masking layer 450 comprising photoresist has been used to pattern the silicon-based layer 440. An anisotropic plasma etch process may be used to transfer the photoresist pattern to the silicon-based layer 440. The pattern transfer etch may remove SiARC using, for example, plasma sustained using a gaseous mixture comprising perfluorocarbon and hydrofluorocarbon gases, for example, a mixture comprising tetrafluoromethane ($CF_4$) and trifluoromethane ($CHF_3$). This example etch chemistry removes SiARC selective to SOC and photoresist. The RF source power may be at a frequency of about 40 MHz to about 60 MHz, and RF bias power at a frequency of about 10 MHz to about 15 MHz, for example 13.56 MHz. In one embodiment, the gas flow may be from about 50 sccm to about 300 sccm at a chamber pressure of about 20 mTorr to about 100 mTorr.

By using hydrofluorocarbon (e.g., CHF 3) in the gaseous mixture, the photoresist may be coated with a thin layer of polymer deposited while the silicon-based layer 440 is being etched. The polymer coating provides a benefit of protecting the sacrificial masking layer 450 from ion sputtering loss during anisotropic etching process. A controlled overetch time may be used to ensure that the etch stops on the organic layer 430. Any polymer residue that may remain on the surface of the organic layer 430 may be removed by ion sputtering during a subsequent anisotropic plasma etch of the organic layer 430. The subsequent anisotropic plasma etch of the organic layer 430 also strips any photoresist remaining over the silicon-based layer 440, as illustrated in FIG. 1C.

FIG. 4C illustrates the substrate after transferring the pattern to the organic layer 430 and exposing a top surface of the underlayer 420 using the patterned silicon-based layer 440 as a hard mask layer. The pattern transfer to the organic layer 430 may be done by an anisotropic plasma etch process that removes SOC selective to titanium nitride using, for example, plasma formed from a mixture comprising nitrogen and hydrogen gas, or a mixture comprising carbon monoxide and carbon dioxide gas, or a mixture comprising oxygen gas. The chamber pressure may be selected in the range 10 mTorr to 100 mTorr. The resulting structure, illustrated in FIG. 4C, may be an incoming substrate 400 that may be processed by the cyclic plasma etch process 100 in order to strip the remaining silicon-based layer 440 comprising SiARC selective to the exposed SOC organic layer 430 and exposed underlayer 420 (e.g., titanium nitride layer). As mentioned above, the cyclic plasma etch process wo provides the advantages of removing SiARC efficiently with high selectivity to organics, preserving the shape of patterned features in the organic layer 430 (e.g., sidewall profile), and a low defect count by using a lean etch chemistry.

The incoming substrate 400 may be processed through a plurality of cycles of the cyclic plasma etch process 100. In each cycle, the substrate undergoes three consecutive component processes illustrated successively in FIGS. 4D, 4E, and 4F.

FIG. 4D illustrates the plasma CDE process 110. In the example embodiment, illustrated in FIGS. 4D-4F, the first gas discharge plasma from which the fluorine radicals are extracted may be formed using a first gaseous mixture comprising 100% $NF_3$ or $NF_3$ with Ar added up to 50% of the total gas flow. A low pressure in the range 50 mTorr to 200 mTorr may be used to obtain desirable radical rich plasma. In various embodiments, the gas flow rate for $NF_3$ may be 10 sccm to 500 sccm.

The RF source power may be about 100 W to about 800 W at a frequency of about 40 MHz to about 60 MHz. A low RF bias power may be advantageous in confining the chemical reactions close to the surface by limiting the ions to a low energy range. In configurations where plasma comprising ions at a desired energy range (e.g., about 2 eV to about 20 eV) may be provided using an appropriate RF source power and frequency, no RF bias may be used in addition to the RF source power. For example, in one embodiment, a CCP configuration may be used to sustain plasma powered by an RF source power of about 500 W at a frequency of about 40 MHz without any RF bias. In some other embodiments, plasma may be sustained by RF bias power of about 10 W to about 50 W at a frequency of about 10 MHz to about 15 MHz (e.g., 13.56 MHz) in addition to RF source power in the range 100 W<800 W at a frequency range 40 MHz to 60 MHz.

The removal of silicon-based material, (e.g., SiARC) with a lean chemistry, (e.g., the plasma CDE process 110 using $NF_3$) may be achieved without the complications associated with creating solid deposits, as explained above with reference to FIG. 1E. The reaction byproducts are volatile gases that may be removed from the process chamber by vacuum pumps. For example, the $NF_3$ chemistry used in the plasma CDE process 110 illustrated in FIG. 4D produces volatile gases comprising $SiF_4$ 442, and oxides of nitrogen such as $NO_2$ 444 and NO 446. The volatile gases are shown schematically in FIG. 4D using open circles for fluorine, solid circles for silicon, circles with diagonal hatching denoting oxygen (e.g., from the SiARC), and circles filled with dots being a symbol for nitrogen.

FIG. 4E illustrates the cooldown and cleanup process 130 where the second gaseous mixture is flowing over the substrate in the absence of plasma. The cooldown and cleanup process 130 may be described as a purge step because there are no chemical reactions during this component of the cycle. The pressure during the cooldown and cleanup process 130 may have been increased to about 100 Torr to 500 Torr to flow the second gaseous mixture at a rate of 100 sccm to 500 sccm. In the example embodiment illustrated in FIG. 4E, the second gaseous mixture may comprise $NF_3$ and $H_2$ in a ratio of $NF_3:H_2$ of about 1:9 to about 2:3 by volume. In some other embodiments, the second gaseous mixture may also comprise an inert gas (e.g., argon or helium).

As illustrated in FIG. 4E, a portion of the silicon-based layer 440 has been removed isotropically by the plasma CDE process 110 of this example embodiment. Also, it may be noted that the surface comprising the organic layer 430 and the underlayer 420 has been fluorinated by the fluorine radicals 432 present during the plasma CDE process 110 illustrated in FIG. 4D.

FIG. 4F illustrates the third component of the cycle. In this component of the cycle, a plasma surface modification process 150 may be performed, in which the surface of the substrate, as illustrated in FIG. 4E, is modified to the surface of the substrate, as illustrated in FIG. 4F. As illustrated in FIG. 4F, the adsorbed fluorine radicals 432 of the fluorinated surface in FIG. 4E have been removed, and the surface of the silicon-based layer 440 has been activated with hydrogen radicals 448, indicated by diagonally hatched circles in FIG. 4F. In addition, in this embodiment, some material may be removed from the silicon-based layer 440 because $NF_3$ has been included in the gases used for the plasma surface modification process 150. However, the removal rate is generally low compared to the removal rate during the plasma CDE process 110 illustrated in FIG. 4D. For example, the removal rate during the plasma surface modification process 150 may be from about 10% to about 50% of the removal rate during the plasma CDE process 110.

The hydrogen radicals that participate in the defluorinating reaction forming volatile HF gas, as well as the hydrogen radicals adsorbed on the surface of the silicon-based layer 440 are extracted from the second gas discharge plasma sustained using the third gaseous mixture. During the plasma surface modification process iso, the pressure may be reduced back to the range of 50 mTorr to 200 mTorr. In the example embodiment illustrated in FIG. 4F, the third gaseous mixture may comprise $NF_3$ and $H_2$ in a ratio of $NF_3:H_2$ of about 1:9 to about 2:3 by volume. In various embodiments, the flow rate for the total gaseous mixture may be from about 10 sccm to about 200 sccm.

The RF source and RF bias during the plasma surface modification process 150 are similar to the RF source and RF bias during the plasma CDE process 110. The RF source power may be about 100 W to about 800 W at a frequency of about 40 MHz to about 60 MHz. A low RF bias power may be advantageous in confining the chemical reactions close to the surface by limiting the ions to a low energy range. In configurations where plasma comprising ions at a desired energy range (e.g., about 2 eV to about 20 eV) may be provided using an appropriate RF source power and frequency, no RF bias may be used in addition to the RF source power. For example, in one embodiment, a CCP configuration may be used to sustain plasma powered by an RF source power of about 500 W at a frequency of about 40 MHz without any RF bias. In some other embodiments, plasma may be sustained by RF bias power of about 10 W to about 50 W at a frequency of about 10 MHz to about 15 MHz (e.g., 13.56 MHz) in addition to RF source power in the range 100 W<800 W at a frequency range 40 MHz to 60 MHz.

A plurality of the three-component cycle, illustrated by the cross-sectional views in FIGS. 4D-4F, may be performed to complete the cyclic plasma etch process 100, thereby stripping the SiARC hard mask, which is the patterned silicon-based layer 440, from the incoming substrate 400 (see FIG. 4C). A cross-sectional view of the post-etch substrate 460, shown in FIG. 4G, illustrates the resulting structure after completing the cyclic plasma etch process 100.

Figure 5:
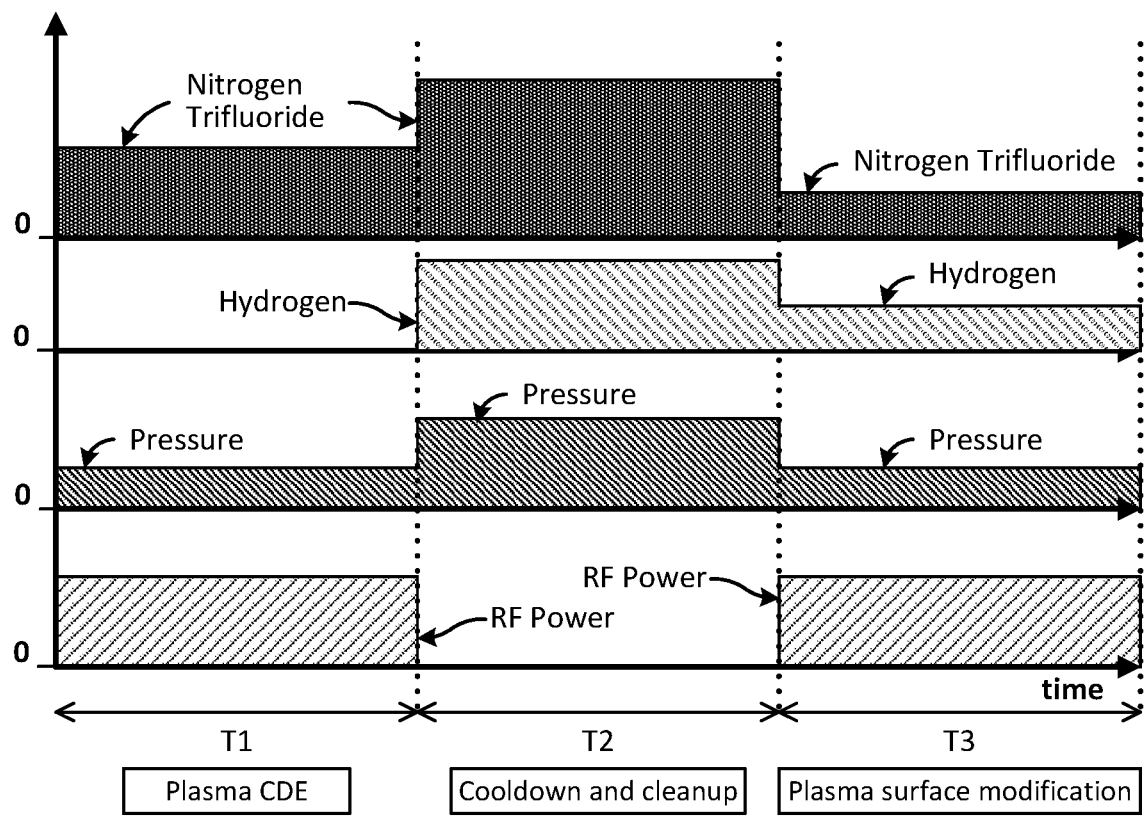
FIG. 5 illustrates a timing diagram for one cycle of a time-multiplexed implementation of the cyclic plasma etch process, illustrated in the flow diagram in FIG. 1D.

FIG. 5 illustrates a timing diagram for one cycle of a time-multiplexed implementation of the example cyclic plasma etch process 100, described with reference to FIGS. 4A-4F. The differences between the processing environment of each of the three segregated portions of the cyclic plasma etch process are illustrated using a timing diagram for one cycle of a time-multiplexed implementation the cyclic plasma etch process, as illustrated in FIG. 5.

The four horizontal axes in FIG. 5 represent progression in time. The three time intervals, T1, T2, and T3, for the three component processes of one cycle of the cyclic plasma etch process 100 are schematically shown by the three double arrows adjacent to one time axis. Three vertical dotted lines intersecting the time axes demarcate the non-overlapping time intervals, T1, T2, and T3. In the example embodiment, T1 may be about 5 s to about 10 s, T2 may be about 5 s to about 10 s, and T3 may be about 5 s to about 10 s. In various embodiments, the ranges for T1, T2, and T3, may be 2 s to 20 S, 2 s to 20 s, and 2 s to 20 s, respectively. The durations T1, T2, and T3 may be unequal, in accordance with the respective process recipe.

The plasma CDE process 110, the cooldown and cleanup process 130, and the plasma surface modification process 150, are performed successively during T1, T2, and T3, respectively, as indicated by the labels in FIG. 5. The four time axes are used to schematically display plots of four process parameters vs. time for one cycle of the plurality of cycles of the example cyclic plasma etch process 100. The four process parameters plotted in FIG. 5 are RF power coupled to the electrodes of the plasma chamber, the chamber pressure, the flow rate of hydrogen gas ($H_2$), and the flow rate of nitrogen trifluoride gas (NF 3).

As illustrated in FIG. 5, RF power is supplied during the time interval, T1, to sustain the first gas discharge plasma used for the plasma CDE process 110, and again during T3 to sustain the second gas discharge plasma used for the plasma surface modification process iso. However, after the plasma CDE process 110 is complete, the RF power is dropped to zero to extinguish the first gas discharge plasma and suppress chemical reactions during the time interval, T2, when the cooldown and cleanup process 130 is in progress.

A low pressure is maintained when the first and second gas discharge plasma are ignited and sustained during T1 and T3, respectively. However, as described above with reference to FIGS. 4A-4F, the chamber pressure and the total gas flow rate for the cooldown and cleanup process 130 have been increased during the second time interval, T2, in the example embodiment for efficient cooldown and cleanup.

The first gaseous mixture comprises $NF_3$ as a source for fluorine radicals. Reducing agents such as hydrogen radicals are undesirable during T1 when the plasma CDE process 110 is performed for efficient conversion of silicon to $SiF_4$ gas to remove silicon-based material. Accordingly, the flow rate for $NF_3$ is high and the flow rate for $H_2$ is zero during T1. The second gaseous mixture flowing through the chamber during T2 is for the cooldown and cleanup process 130. In a time-multiplexed implementation of the cyclic plasma etch process 100, the second gaseous mixture may comprise the same gases used for the third gaseous mixture flown during the following time interval, T3, in order to reduce the gas exchange time needed to stabilize the environment in the plasma process chamber. Accordingly, as illustrated in the respective plots in FIG. 5, both $NF_3$ and $H_2$ are present in the chamber during T2 and T3.

It is noted that the plots in FIG. 5 are for illustrative purposes only. For example, the plots show the process parameters to be changing like step functions, although it is understood that instantaneous changes in RF power, gas pressure, and flow rates are not achievable and that there are finite response times to be accounted for before the physical parameters stabilize.

In this disclosure, embodiments of a cyclic plasma etch process 100 have been described that may be used to strip a patterned silicon-based layer used as a hard mask for an anisotropic plasma etch process that transfers the pattern to an organic layer adjacent below the silicon-based layer. Silicon-based materials are often used as an inorganic anti-reflective coating (ARC) to suppress formation of undesired interference patterns in a photoresist layer caused by reflections from underlying interfaces when exposing the photoresist to a pattern of actinic radiation in a photolithography process. In an example application, described in this disclosure, an SiARC layer patterned with a photoresist mask and, subsequently, used as a hard mask to pattern an SOC layer is shown being stripped using an embodiment of the cyclic plasma etch process 100 to illustrate the advantages provided by the inventive process. As explained above, by using appropriate embodiments of the cyclic plasma etch process wo described in this disclosure, the silicon-based material may be efficiently removed selective to organic materials. Furthermore, the pattern quality of features in the patterned organic layer may be maintained as chemical as well as thermal deformation has been reduced by using a lean fluorine etch chemistry (e.g., non-polymerizing etchants such as $CF_4$, $NF_3$ and $SF_6$) and by inserting a cooldown and cleanup process 130 after the plasma CDE process 110 in each cycle of the cyclic plasma etch process 100. The removal efficiency for silicon-based materials and selectivity to organics have been aided by performing a plasma surface modification process 150 in each cycle before proceeding to the plasma CDE process 110 of the next cycle. As explained in this disclosure, hydrogen radicals are used to aid the removal reaction by activating the surface comprising the silicon-based material, and protect other areas of the exposed surface by a defluorinating reaction forming volatile hydrogen fluoride. The removal of adsorbed fluorine radicals from the sidewalls comprising organic material and the bottom wall comprising the underlayer material improves etch selectivity and retards pattern deformation.

It has been explained that the method of segregating the process into a plurality of cycles and segregating each cycle into three component processes may be implemented in two classes of plasma systems. A time-multiplexed implementation may comprise performing the component processes in situ in a plasma process chamber. A spatially segregated implementation may be achieved by loading the substrate on a movable stage and moving the substrate through spatially segregated sections of a spatial plasma chamber.

Segregating the process in three component processes facilitates achieving the advantages mentioned herein by allowing independent selection of process parameters, as illustrated in this disclosure by describing a timing diagram for a time-multiplexed implementation of one example embodiment. Preserving the fidelity of the pattern transferred to the organic layer is advantageous because, in various applications, the organic layer is used as a hard mask layer for patterning the underlayer.

Example 1. A method for processing a substrate includes performing a cyclic plasma etch process including a plurality of cycles, where each cycle of the plurality of cycles includes: causing chemical reactions with the surface of the substrate by exposing a surface of the substrate to fluorine radicals extracted from a first gas discharge plasma formed using a first gaseous mixture including a non-polymerizing fluorine compound. The method includes flowing a second gaseous mixture over the substrate, and at the same time, suppressing the chemical reactions with the surface of the substrate. The method includes exposing the surface of the substrate to hydrogen radicals extracted from a second gas discharge plasma formed using a third gaseous mixture including gases including nitrogen and hydrogen.

Example 2. The method of example 1, where the surface of the substrate includes: a first portion including a silicon-based material; and a second portion including an organic material.

Example 3. The method of one of examples 1 or 2, where exposing the surface of the substrate to fluorine radicals removes the silicon-based material selective to the organic material.

Example 4. The method of one of examples 1 to 3, where exposing the surface of the substrate to hydrogen radicals chemically modifies the surface of the substrate, where chemically modifying the surface includes: forming an adsorption layer of hydrogen and nitrogen on the first portion including a silicon-based material; and defluorinating the second portion including an organic material.

Example 5. The method of one of examples 1 to 4, where the first gaseous mixture includes nitrogen trifluoride or sulfur hexafluoride.

Example 6. The method of one of examples 1 to 5, where flowing the second gaseous mixture cools the substrate and removes residual gaseous byproducts.

Example 7. The method of one of examples 1 to 6, where suppressing chemical reactions with the surface of the substrate includes preventing the second gaseous mixture from forming a gas discharge plasma.

Example 8. The method of one of examples 1 to 7, where the exposing the surface of the substrate to fluorine radicals, the flowing the second gaseous mixture over the substrate, and the exposing the surface of the substrate to hydrogen radicals are performed in three spatially non-overlapping regions, where a curtain of inert gas is disposed between adjacent regions of the three spatially non-overlapping regions; and where performing one cycle of the cyclic etch process includes moving the substrate successively through the three spatially non-overlapping regions.

Example 9. A method for processing a substrate includes performing a cyclic plasma etch process including a plurality of cycles, where each cycle of the plurality of cycles includes performing a plasma etch process on a surface of the substrate that includes a silicon-based material to partially remove the silicon-based material, cooling the substrate and concurrently removing residual gaseous byproducts, and performing a plasma surface modification process on the substrate.

Example 10. The method of example 9, further including: performing the plurality of cycles in situ in a plasma process chamber.

Example 11. The method of one of examples 9 or 10, where the plasma etch process is performed in a first time interval, the cooling and the concurrently removing residual gaseous byproducts is performed in a second time interval, and the plasma surface modification process is performed in a third time interval; and where the first time interval, the second time interval, and the third time interval are non-overlapping time intervals.

Example 12. The method of one of examples 9 to 11, further including: increasing the pressure in a plasma process chamber performing the plurality of cycles after the first time interval; maintaining the increased pressure in the plasma process chamber during the second time interval; and reducing the pressure in the plasma process chamber after the second time interval.

Example 13. The method of one of examples 9 to 12, where performing the plasma etch process includes: forming a gas discharge plasma, the plasma including fluorine radicals, where the forming the gas discharge plasma includes coupling radio frequency (RF) power to a gaseous mixture including a non-polymerizing fluorine compound; and removing silicon-based material by using non-polymerizing fluorine-based chemistry.

Example 14. The method of one of examples 9 to 13, where the cooling the substrate and concurrently removing residual gaseous byproducts includes: extinguishing the gas discharge plasma by decoupling radio frequency (RF) power from the plasma process chamber; and increasing gas flow rate of a gaseous mixture through the plasma process chamber.

Example 15. The method of one of examples 9 to 14, where performing the plasma surface modification process includes: forming a gas discharge plasma using a gaseous mixture including gases including nitrogen and hydrogen, the plasma including hydrogen radicals; chemically reacting the surface of the substrate with hydrogen radical, where reacting the surface includes: forming an adsorption layer of hydrogen and nitrogen on a portion of the surface of the substrate including silicon-based material; and removing fluorine radicals adsorbed on the remaining portion of the surface of the substrate by forming gaseous hydrogen fluoride.

Example 16. A method for fabricating a semiconductor device includes forming a stack of patterned layers adjacent to an underlayer in a substrate. The stack of patterned layers includes an organic layer adjacent to the underlayer; and a hardmask layer including a silicon-based material over the organic layer; loading the substrate in a plasma processing chamber. The method includes performing a cyclic plasma etch process in situ in the plasma process chamber, where the cyclic plasma etch process removes the hard mask layer including a silicon-based material selective to the organic layer.

Example 17. The method of example 16, where the cyclic plasma etch process includes a plurality of cycles, where each cycle of the plurality of cycles includes: performing a chemical dry etch (CDE) process including exposing the substrate to fluorine radicals extracted from a first gas discharge plasma formed in the plasma process chamber using a first gaseous mixture including nitrogen trifluoride or sulfur hexafluoride; after completing the CDE process, extinguishing the first gas discharge plasma, and cooling the substrate by increasing the pressure in the plasma processing chamber and flowing a second gaseous mixture over the substrate; and after completing the cooling the substrate, performing a plasma surface modification process including exposing the surface of the substrate to hydrogen radicals, where the hydrogen radicals activate the surface including the silicon-based material by chemisorption and defluorinate the surface including the organic material by a chemical reaction forming volatile hydrogen fluoride.

Example 18. The method of one of examples 16 or 17, where the silicon based material includes a silicon-rich antireflective coating (SiARC), silicon oxide, silicon nitride, or silicon oxynitride.

Example 19. The method of one of examples 16 to 18, where the organic layer includes an organic dielectric layer (ODL), an organic planarization layer (OPL), a spin-on carbon (SOC) layer, or an amorphous carbon layer (ACL), where the underlayer includes titanium nitride, aluminum oxide, titanium oxide, or aluminum nitride.

Example 20. The method of one of examples 16 to 19, where after performing the cyclic plasma etch process, the change in sidewall angle of the organic layer is less than or equal to 0.5°.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:
1. A method for processing a substrate, the method comprising:

performing a cyclic plasma etch process comprising a plurality of cycles, wherein each cycle of the plurality of cycles comprises:
  causing chemical reactions with the surface of the substrate by exposing a surface of the substrate to fluorine radicals extracted from a first gas discharge plasma formed using a first gaseous mixture comprising a non-polymerizing fluorine compound;
  flowing a second gaseous mixture over the substrate, and at the same time, suppressing the chemical reactions with the surface of the substrate, the second gaseous mixture being different from the first gaseous mixture and comprising hydrogen; and
  exposing the surface of the substrate to hydrogen radicals extracted from a second gas discharge plasma formed using a third gaseous mixture comprising gases comprising nitrogen and hydrogen.

2. The method of claim 1, wherein the first gaseous mixture comprises nitrogen trifluoride or sulfur hexafluoride.

3. The method of claim 1, wherein flowing the second gaseous mixture cools the substrate and removes residual gaseous byproducts.

4. The method of claim 1, wherein suppressing chemical reactions with the surface of the substrate comprises preventing the second gaseous mixture from forming a gas discharge plasma.

5. The method of claim 1, wherein the exposing the surface of the substrate to fluorine radicals, the flowing the second gaseous mixture over the substrate, and the exposing the surface of the substrate to hydrogen radicals are performed in three spatially non-overlapping regions, wherein a curtain of inert gas is disposed between adjacent regions of the three spatially non-overlapping regions; and
  wherein performing one cycle of the cyclic etch process comprises moving the substrate successively through the three spatially non-overlapping regions.

6. The method of claim 1, wherein the first gaseous mixture comprises carbon tetrafluoride and oxygen.

7. The method of claim 1, wherein the surface of the substrate comprises:
  a first portion comprising a silicon-based material; and
  a second portion comprising an organic material.

8. The method of claim 7, wherein exposing the surface of the substrate to fluorine radicals removes the silicon-based material selective to the organic material.

9. The method of claim 7, wherein exposing the surface of the substrate to hydrogen radicals chemically modifies the surface of the substrate, wherein chemically modifying the surface comprises:
  forming an adsorption layer of hydrogen and nitrogen on the first portion comprising a silicon-based material; and
  defluorinating the second portion comprising an organic material.

10. A method for processing a substrate, the method comprising:
  performing a cyclic plasma etch process comprising a plurality of cycles in a plasma processing chamber, wherein each cycle of the plurality of cycles comprises:
    performing a plasma etch process on a surface of the substrate that comprises a silicon-based material to partially remove the silicon-based material;
    after the plasma etch process, increasing a pressure in the plasma process chamber performing the plurality of cycles;
    cooling the substrate and concurrently removing residual gaseous byproducts while maintaining the increased pressure in the plasma process chamber;
    after cooling the substrate and concurrently removing the residual gaseous byproducts, reducing the pressure in the plasma process chamber; and
    performing a plasma surface modification process on the substrate.

11. The method of claim 10, wherein the plasma etch process is performed in a first time interval, the cooling and the concurrently removing residual gaseous byproducts is performed in a second time interval, and the plasma surface modification process is performed in a third time interval; and
  wherein the first time interval, the second time interval, and the third time interval are non-overlapping time intervals.

12. The method of claim 10, wherein performing the plasma surface modification process comprises:
  forming a gas discharge plasma using a gaseous mixture comprising gases comprising nitrogen and hydrogen, the plasma comprising hydrogen radicals;
  chemically reacting the surface of the substrate with hydrogen radical, wherein reacting the surface comprises:
    forming an adsorption layer of hydrogen and nitrogen on a portion of the surface of the substrate comprising silicon-based material; and
    removing fluorine radicals adsorbed on a remaining portion of the surface of the substrate that does not comprise the silicon-based material by forming gaseous hydrogen fluoride.

13. The method of claim 10, wherein performing the plasma etch process comprises:
  forming a gas discharge plasma, the plasma comprising fluorine radicals, wherein the forming the gas discharge plasma comprises coupling radio frequency (RF) power to a gaseous mixture comprising a non-polymerizing fluorine compound; and
  removing silicon-based material by using non-polymerizing fluorine-based chemistry.

14. The method of claim 13, wherein the cooling the substrate and concurrently removing residual gaseous byproducts comprises:
  extinguishing the gas discharge plasma by decoupling radio frequency (RF) power from the plasma process chamber; and
  increasing gas flow rate of a gaseous mixture through the plasma process chamber.

15. A method for fabricating a semiconductor device on a substrate, the method comprising a cyclic plasma etch process, the substrate comprising a silicon-based material and an organic layer, wherein the cyclic plasma etch process comprises a plurality of cycles, wherein each cycle of the plurality of cycles comprises:
  performing a chemical dry etch (CDE) process comprising exposing the substrate to fluorine radicals extracted from a first gas discharge plasma formed in the plasma process chamber using a first gaseous mixture comprising nitrogen trifluoride or sulfur hexafluoride;
  after completing the CDE process, extinguishing the first gas discharge plasma, and cooling the substrate by increasing the pressure in the plasma processing chamber and flowing a second gaseous mixture over the substrate; and
  after completing the cooling the substrate, performing a plasma surface modification process comprising exposing the surface of the substrate to hydrogen radicals, wherein the hydrogen radicals activate a surface comprising the silicon-based material by chemisorption and defluorinate a surface comprising the organic layer by a chemical reaction forming volatile hydrogen fluoride.

16. The method of claim 15, wherein the silicon based material comprises a silicon-rich antireflective coating (SiARC), silicon oxide, silicon nitride, or silicon oxynitride.

17. The method of claim 15, wherein the organic layer comprises an organic dielectric layer (ODL), an organic planarization layer (OPL), a spin-on carbon (SOC) layer, or an amorphous carbon layer (ACL), wherein the underlayer comprises titanium nitride, aluminum oxide, titanium oxide, or aluminum nitride.

18. The method of claim 15, wherein after performing the cyclic plasma etch process, the change in sidewall angle of the organic layer is less than or equal to 0.5°.

19. The method of claim 15, further comprising:
before the cyclic plasma etch process, forming a stack of patterned layers adjacent to an underlayer in the substrate, the stack of patterned layers comprising:
the organic layer adjacent to the underlayer; and
a hardmask layer comprising the silicon-based material over the organic layer; and
loading the substrate in a plasma processing chamber for the cyclic plasma etch process.

20. The method of claim 19, wherein forming the stack of patterned layers further comprising patterning the organic layer using the hardmask layer as an etch mask.

* * * * *